United States Patent [19]

Sonnenberg et al.

[11] Patent Number: 5,667,662
[45] Date of Patent: Sep. 16, 1997

[54] ELECTROPLATING PROCESS AND COMPOSITION

[75] Inventors: Wade Sonnenberg, Upton; Patrick J. Houle, Framingham; Thong B. Luong, Springfield; James G. Shelnut, Northboro; Gordon Fisher, Sudbury, all of Mass.

[73] Assignee: Shipley Company, L.L.C., Marlborough, Mass.

[21] Appl. No.: 625,126

[22] Filed: Apr. 1, 1996

[51] Int. Cl.[6] .............................. C25D 5/02; C25D 5/56; C25D 7/00; H01B 1/00
[52] U.S. Cl. .................... 205/162; 205/163; 205/166; 205/183; 205/920; 205/118; 205/125; 252/500
[58] Field of Search .................... 205/125, 162, 205/163, 164, 166, 183, 920; 252/500

[56] References Cited

U.S. PATENT DOCUMENTS 4,526,706  7/1985  Upson et al. ........................ 252/500
5,415,762  5/1995  Allardyce et al. ................... 205/166

OTHER PUBLICATIONS

Gottsfeld et al., *J. Electrochem. Soc.*, vol. 139, No. 1, Jan. 1992, pp. 14–15.

*Primary Examiner*—Kathryn L. Gorgos
*Assistant Examiner*—Edna Wang
*Attorney, Agent, or Firm*—Robert L. Goldberg

[57] ABSTRACT

A process for electroplating a nonconducting substrate comprising formation of a film of a conductive polymer on the surface of a nonconducting substrate and electrolytic deposition of metal thereover. The conductive film is formed by deposition of the conductive polymer onto said surface from an aqueous suspension of said polymer containing a polymeric stabilizer having repeating alkylene oxide groups and a hydrophilic—lipophilic balance of at least 10.

9 Claims, No Drawings

ELECTROPLATING PROCESS AND COMPOSITION

BACKGROUND OF THE INVENTION

1. Introduction

This invention relates to electroplating nonconductors, and more particularly, to processes and compositions for electroplating the surface of a nonconductor using a stabilized preformed dispersion of a conductive polymer that functions as a base for direct electroplating when adsorbed onto a nonconducting surface. The invention is especially useful for the manufacture of electronic devices such as printed circuit boards.

2. Description of the Prior Art

Nonconducting surfaces are conventionally metallized by a sequence of steps comprising catalysis of the surface of the nonconductor to render the same catalytic to electroless metal deposition followed by contact of said catalyzed surface with a plating solution that deposits metal over the catalyzed surface in the absence of an external source of electricity. Metal plating continues for a time sufficient to form a metal deposit of the desired thickness. Following electroless metal deposition, the electroless metal deposit is optionally reinforced by electrodeposition of a metal over the electroless metal coating to obtain a desired thickness. Catalyst compositions useful for electroless metal plating are known in the art. A typical catalyst composition consists of an aqueous colloid of a noble metal such as palladium.

Electroless plating solutions are aqueous solutions containing both a dissolved metal and a reducing agent in solution. The presence of the dissolved metal and reducing agent together in solution results in plate-out of metal when the solution is in contact with a catalytic surface. However, the presence of the dissolved metal and reducing agent together in solution can also result in solution instability and indiscriminate deposition of metal on the walls of containers for such plating solutions. In addition, such plating solutions utilize a complexing agent to hold the metal dissolved in solution. Complexing agents are difficult to waste treat. The reducing agent for such solutions is typically formaldehyde. Formaldehyde is toxic and subject to environmental regulations.

For the aforesaid reasons, attempts have been made to avoid use of an electroless plating solution by the practice of a direct plating process whereby a metal may be deposited directly onto an electrically nonconducting substrate treated to render the same semiconductive. One such process is disclosed in U.S. Pat. No. 3,099,608, incorporated herein by reference. The process of this patent involves treatment of nonconducting surface with a palladium colloid which forms a semi-conductive film of colloidal palladium particles over the nonconductive surface. For reasons not fully understood, it is possible to electroplate directly over the catalyzed surface of the nonconductor from an electroplating solution though deposition occurs by propagation and growth from a conductive surface. The deposit grows epitaxially along the catalyzed surface from this interface. For this reason, metal deposition onto the substrate using this process is slow. Moreover, deposit thickness may be uneven with the thickest deposit occurring at the interface with the conductive surface and the thinnest deposit occurring at a point most remote from the interface.

U.K. Patent No. 2,123,036 13, incorporated herein by reference, is said to disclose an improvement to the above-described process. In accordance with the process of this patent, a surface is provided with metallic sites and said surface is electroplated from an electroplating solution containing an additive that is described by the patentee as inhibiting deposition of metal on metallic surfaces without inhibiting deposition on the metallic sites over the nonconducting surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconducting surface in a solution of a tin-palladium colloid. The additive in the electroplating solution responsible for inhibiting deposition is described as one selected from a group of dyes, surfactants, chelating agents, brighteners and leveling agents. Many of such materials are conventional additives for electroplating solutions.

Further improvements in processes for the direct electroplating of nonconductors are disclosed in U.S. Pat. Nos. 4,895,739; 4,919,768 and 4,952,286, each incorporated herein by reference. In accordance with the processes of these patents, an electroless plating catalyst is treated with an aqueous solution of a chalcogen, such as a sulfur solution to convert the catalytic surface to a chalcogenide. By conversion of the surface to the chalcogenide, greater conductivity is achieved and faster plating rates are possible.

The processes claimed in the aforementioned patents provide a substantial improvement over the process described in the U.K. Patent. However, it has also been found that treatment of an adsorbed catalytic metal over a nonconductor with a solution of a chalcogenide, especially a sulfide solution, results in formation of a chalcogenide on all metal surfaces in contact with the solution of the chalcogen. Therefore, if the process is used in the manufacture of printed circuit boards, the copper cladding or conductors of the printed circuit board base material are converted to the chalcogenide together with the catalytic metal. If the chalcogenide of the copper is not removed prior to plating, it can reduce the bond strength between the copper and a subsequently deposited metal over the copper.

A further advance in the direct plating of the surfaces of nonconductors is disclosed in published European Application No. 0 520 1915, incorporated herein by reference. In accordance with the invention described therein, a stable colloidal solution of a preformed catalytic chalcogenide is prepared and a surface is then contacted with the colloidal composition whereby the colloidal chalcogenide adsorbs on said surface. Thereafter, the nonconductor may be electroplated following procedures disclosed in the aforesaid U.S. Pat. Nos. 4,895,739; 4,919,768 and 4,952,286.

An alternative direct plate process is disclosed in PCT published application No. 89/00204, incorporated herein by reference. In accordance with the process of said published application, the surface of a substrate is pretreated with a solution having an oxidizing capability, removed from said solution and rinsed, introduced into a solution containing a monomer such as a pyrrole, furane, thiophene or its derivatives, which in a polymeric or copolymeric form is electrically conductive; the surface is then transferred into an acidic solution whereby an electrically conductive polymer layer, such as polymerized or copolymerized pyrrole, furane, thiophene or derivative is formed, residual solution is removed by rinsing; and the coating formed over the substrate is then semiconductive and capable of direct electroplating. In accordance with this process, the oxidative pretreatment solution contains salts of permanganate, manganate, periodate and/or cerium IV. The monomer is present in a suitable solvent in an amount of from 5 to 35 % by weight. The substrate is immersed in the monomer solution for a time ranging from about several seconds to 20 minutes. Room temperature treatment is satisfactory. The solution used to activate the monomer may contain an oxidative substance such as alkali metal persulfate, alkali metal peroxydisulfate, hydrogen peroxide, an iron salt such as ferric chloride, alkali metal periodates or similar compounds in acidic solution. A solution containing an active oxidizing agent in an amount of from 25 to 75 grams per liter of solution is usually considered satisfactory. Treatment can be at room temperature with immersion times of from 1 to 10 minutes and treatment is complete when a dark brown or black coloration is formed on the surface of the substrate. Difficulties encountered with this procedure include incomplete coverage of glass fibers and or epoxy or FR4 epoxide/glass printed circuit board substrate which can lead to discontinuities in the coating and the use of volatile organic compounds in the process sequence which may be toxic.

A modification to the above process is disclosed by Gottsfeld at al, *J. Electrochem. Soc.*, Vol. 139, No. 1, January 1992, pp. 14–15. In this process, a substrate to be plated is immersed directly into a solution of the oxidant and the monomer is then added to the solution to cause in situ formation of polymer in the presence of the substrate. Disadvantages to this process include the formation of polymer on all surfaces in contact with the solution—i.e., the container walls as well as the substrate, a limited life of the treatment solution and possible monomer toxicity.

In U.S. Pat. No. 5,415,762 incorporated herein by reference, an additional method for direct electroplating of nonconducting surfaces is disclosed. This method uses an aqueous or semi-aqueous suspension of a conductive polymer. The suspension may be in the form of a colloid or emulsion dependent upon the physical form of the conductive polymer. Using this suspension, a circuit board would be fabricated by a process where the first step comprises preparation of the circuit board substrate for plating. This includes formation of throughholes, desmearing of the hole walls, conditioning of the hole walls to improve adhesion and etching of the copper cladding to clean the same. Thereafter, the substrate is contacted with the suspension of the conductive polymer. The suspension is desirably formulated to be attracted to the conditioned dielectric surfaces. Thereafter, the substrate is electroplated in conventional manner. The patent further discloses that any conductive polymer suitable for suspension in aqueous media may be used with preferred conductive polymers including polypyrrole, polyaniline and polythiophene or derivatives thereof.

The suspension of a conductive polymer disclosed in U.S. Pat. No. 5,415,762 functions as described in said patent. However, it has been found that in storage, the particles may aggregate and precipitate. This limits the commercial suitability of the suspension as it is difficult to package the same and store the suspension for a prolonged period of time prior to use. It is known in the art that suspensions of organic particles may be stabilized to prevent aggregation, but it has been found in practice that these stabilizers tend to reduce the conductivity of a coating of organic conductive polymer particles adsorbed onto a substrate making it difficult to obtain complete coverage during electroplating.

SUMMARY OF THE INVENTION

The subject invention is for a suspension of a conductive polymer characterized by enhanced stability as a consequence of the addition of an alkylene oxide stabilizer to the solution having a hydrophilic—lipophilic balance (HLB) in excess of 10, more preferably, a stabilizer having an HLB in excess of 12, and most preferably, an HLB in excess of 15. The most preferred stabilizer is one having at least 3 alkylene oxide repeating units, which may be the same or different. The stabilizer is desirably added to the formulation at the time that the suspension is prepared and prior to formation of the particles.

The suspension of the conductive polymer is used in the same manner as is the conductive polymer of U.S. Pat. No. 5,415,752. However, it has been unexpectedly found that the use of the preferred stabilizers substantially increase shelf life of the suspension without loss in conductivity of a coating of the particles of the conductive colloid adsorbed onto a substrate.

DESCRIPTION OF THE PREFERRED EMBODIMENTS

The stabilized conductive polymer suspension of the subject invention is suitable for manufacture of a variety of commercial articles where a metal deposit is desired over the surface of a nonconductor. However, the invention is especially suitable for the fabrication of printed circuit boards. For this reason, the description that follows is directed primarily to printed circuit board fabrication.

As set forth above, the invention described involves the use of a stabilized preformed suspension of a conductive polymer that is adsorbed onto the dielectric surface of a part to be plated to form a semiconductive coating suitable for electroplating. In the conventional method for making such a suspension, a solution of a monomer and an oxidant are mixed to form a colloid, frequently in the presence of a dispersed phase such as colloidal silica, the colloid is recovered by filtration, coagulation or centrifugation and then washed and redispersed in a suitable dispersant. Conventional methods for formation of such colloids are known in the art. For example, methods for making polyanaline are described by Gill et al, "Novel Colloidal Polyaniline—Silica Composites", *J.P. Chem. Soc., Chem. Commun.*, 1992, pp. 108 and 109; by Armin at al, "Synthesis Of Novel Polyaniline Colloids Using Chemically Grafted Poly(N-vinyl pyrrolidone)—Base Stabilizers", *Journal of Colloid and Interface Science*, Vol. 150, No. 1, 1992, pp. 134–142, and by Bay at al, "Poly(1-vinylimidazole-co-4-aminostyrene): Steric Stabilizer For Polyaniline Colloids", *Polymer,* 1991, Vol. 32, No. 13, pp. 2456–2460. The preparation of colloids of polypyrrole is disclosed by Armes et al, "Preparation and Characterization of Colloidal Dispersions of Polypyrrole Using poly(2-vinylpyrdine)-based Steric Stabilizers", *Polymer,* 1390, Vol. 31, March, pp 569–574. Further details regarding formation of polymers using the method described by Armes can be found in U.S. Pat. No. 4,059,162. Each of the aforesaid references are incorporated herein by reference for their teaching of materials and oxidative procedures for making conductive polymer colloids.

In accordance with one aspect of the invention described in U.S. Pat. No. 5,415,752, the above-described procedures for the formation of a suspension of a conductive polymer are modified by elimination of the steps of collecting the suspended particles and redispersing the same in an acid solution. To eliminate the redispersion step, it is disclosed in said patent that it is desirable to form the suspension in the presence of a stabilizing agent for the particles. It is also disclosed in said patent that stabilizing agents are desirable to prevent aggregation and precipitation of the suspended particles.

The use of stabilizing agents to enhance stability of suspended particles is known to the art. However, it has been found that when stabilizing agents are used, the particles are coated with the stabilizer resulting in a loss of conductivity. Consequently, when the particles are adsorbed onto a substrate as a layer, the layer so formed is insufficiently conductive for metal plating. Therefore, it is believed that prior to the subject invention, the art was incapable of providing a stable colloid of conductive particles suitable for storage and then use as a conductive coating.

In accordance with the subject invention, it has been found that to provide prolonged stability, an alkoxylated stabilizer having an HLB in excess of 10 must be used. To have prolonged stability without a noticeable reduction in conductivity of a layer of the adsorbed colloid on a substrate, the alkoxylated stabilizer must have an HLB of at least 12 and preferably at least 15. One preferred class of stabilizers in accordance with the invention are those non-ionic polyethers having polyalkylene oxide blocks and conforming to the following formula:

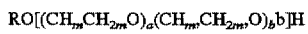

$$RO[(CH_mCH_{2m}O)_a(CH_{m'}CH_{2m'}O)_b]H$$

where R is a hydrocarbon group having from 1 to 40 carbon atoms, m and m' differ from each other and each is one or more whole integers of from 1 to 4, preferably 2 or 3, and a and b are whole integers varying between 0 and 1,000 provided that a+b is at least 3, preferably between 7 and 50. R may be aliphatic or aromatic. Exemplary aliphatic groups are ethyl, propyl, butyl, octyl, decyl, dodecyl, etc. Exemplary aromatic groups are benzyl and naphthyl, especially alkyl substituted benzyls. The formula above is intended to include copolymers such as mixed alkylene oxide including copolymers containing ethylene oxide and propylene oxide blocks.

Another class of preferred stabilizers are electrosteric stabilizers having the requisite HLB and an ionic charge chemically bonded to the end of a hydrophilic nonionic moiety and at least twenty ethylene oxide groups in its chain conforming to the following structural formula:

$$RO[(CH_mCH_{2m}O)_a(CH_{m'}CH_{2m'}O)]_bARM'M$$

where R, m, m', a and b are as defined above, R' is an alkyl group having from 1 to 8 carbon atoms, A is an anion such as carboxylate, phosphate, sulphonate, etc., and M is a counteracting cation such as an alkali metal inclusive of sodium and potassium; ammonium; or an alkaline earth metal such as calcium or magnesium. A more preferred stabilizer within the above class is one where R is alkyl having from 10 to 20 carbon atoms, A is—SO$_3$, n is an odd number and M is sodium.

A preferred stabilizer within the above class of materials conforms to the formula:

$$C_{m''}H_{2m''+1}(OC_2H_4)_nOSO_3M$$

where m" is a whole integer ranging between 3 and 20, M is an alkali metal and n varies between 3 and 1,000 and preferably, between 7 and 50.

Other surfactants suitable for use in accordance with the invention include alkylphenol ethoxylates, alcohol ethoxylates, tristrylphenol ethoxylates and mercaptan ethoxylates, all sold under the trade name Ipegal or Rhodasurf, and oleyl alcohol ethoxylates also sold under the Rhodasurf tradename.

With respect to HLB values given above, it should be understood that the numerical values given are for systems utilizing water as the dispersant for the conductive particles. If a water miscible organic solvent such as an alcohol is added to the dispersant for the particles, the polarity of the dispersant will normally be reduced. The desired HLB of the stabilizer should be altered, typically reduced, in proportion to the reduction in the polarity of the dispersant. The change in HLB may have to be determined by routine experimentation.

The concentration of the stabilizer in suspension may vary from about 0.1 to 20 parts by weight per part of dispersed phase and preferably varies between about 0.5 and 2 parts per part of dispersed phase. Preferably, and where possible, the suspending agent is added to the dispersant prior to formation of the particles whereby the particles are stabilized as they are formed.

The preferred method for formation of the conductive polymer in accordance with the invention comprises formation of a solution of the stabilizing agent, other additives as desired and monomer. Thereafter, the oxidant is added with agitation to form the polymer in the presence of the stabilizing agent and to disperse the polymer in its dispersant. Reaction conditions are in air at room or slightly below room temperature as necessary to dissolve the reactants. The monomers, oxidants, solvents and reaction conditions are as described in the above cited references illustrating the formation of conductive polymer colloids.

The following description illustrates the manner in which the colloid of the conductive polymer may be used in printed circuit board manufacture. For such manufacture, the substrate commonly used is an epoxy substrate filled with glass fibers and copper clad on at least one of the surfaces. As is known in the art, the epoxy may be mixed with other resins for specific purposes.

In the manufacture of a printed circuit board, a first step comprises the formation of through-holes or vias by drilling or punching or any other method known to the art. If the board is a double sided or multilayer board, following formation of the vias, it is desirable to employ the conventional step of desmearing the holes using sulfuric acid, chromic acid or an alkaline permanganate solution. Thereafter, the circuit board base material is optionally treated with a glass etch that removes glass fibers extending into the holes from the hole-walls. This is followed by a solution that cleans the copper surface and conditions the hole walls to promote catalyst adsorption. Such solutions are often referred to as cleaner-conditioners and typically comprise an aqueous surfactant solution for cleaning soil and a material carrying a charge opposite from the charge of the conductive polymer in suspension to facilitate adsorption of the suspension of the conductive polymer on the surface. Use of a cleaner-conditioner for noble metal colloids is well known in the art and it has been discovered that a number of such conditioners may be used for the suspensions of the present invention. Proprietary cleaner-conditioners are commercially available. A suitable material is available from Shipley Company, L.L.C. of Marlboro, Mass. and is identified as XP9420, an aqueous solution of a polyamine polyelectrolyte. Copper cladding may optionally then be etched to remove tarnish and preferably lightly etched. Proprietary microetches are commercially available. A suitable material is available from Shipley Company L.L.C. and identified as Preposit Etch 746. The etch should be used at room temperature and contact with the substrate should be for a period of time ranging between about 30 seconds and 10 minutes.

Following the above preparation steps, the processing sequence of the invention may be employed. The next step in the process comprises immersion of the part to be plated in the suspension of the conductive colloid. The preferred material for purposes of the subject invention is a suspension of polypyrrole. The treatment conditions for immersion of the substrate in the suspension of the conductive polymer are not critical provided sufficient polymer is adsorbed onto the surface to enable plating to take place. Preferably, treatment times vary from about 30 seconds to 30 minutes and more preferably, vary between about 2 and 10 minutes. The temperature may vary from about −30° C. to near the boiling point of the dispersion, but below room temperature treatment is preferred. Concentration of the conductive polymer in its suspension should be sufficient for formation of a coating on a substrate immersed in the suspension that is sufficiently conductive to enable the electrodeposition of metal over the coating. In general, to achieve such conductivity, the concentration of the conductive polymer in suspension may vary between about 0.1 and 30 weight percent of the suspension and more preferably, between 0.2 and 5 weight percent. Treatment of the substrate with the suspension of the conductive polymer results in the formation of an adsorbed layer of the conductive polymer over the nonconductive surface. The conductive polymer on the dielectric is suitable for direct electroplating. A step of copper etching follows adsorption of the conductive polymer.

The next step in the process of the invention comprises electroplating directly over the adsorbed layer of the conductive polymer. The electroplating procedure is similar to the procedure disclosed in the above referenced U.K. patent, but careful control of the electroplating parameters as required in the U.K. patent is not necessary in the process of this invention. The electroplating process may use electroplating solutions such as those disclosed in the U.K. patent, but most commercially available electroplating solutions contain additives which make the same suitable for the process of the invention. The preferred electroplating metals in accordance with the invention are copper and nickel, though the process is suitable for electroplating of any desired metal. A typical electroplating solution comprises an aqueous acid solution of the metal desired to be plated together with proprietary additives from the group of dyes, surfactants, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other n-heterocyclic compounds. Typical brighteners used in such formulations include organo sulfur compounds such as mercapto propane sulfonic acid and derivatives thereof. The additives described above are added to the solution in conventional concentrations.

The electroplating procedure is conventional. The part to be plated is racked as part of a cathode in a conventional electroplating cell. Current density is conventional and varies typically within a range of from 0.5 to 5 amp per $dm^2$, dependent upon the part to be plated. For example, factors affecting current density in the plating of through hole circuit boards include the diameter of the through-holes, the thickness of the board and the composition of the electroplating solution used. The plating solution is maintained at a temperature ranging between room temperature and about 140° F. Plating is continued for a time sufficient to form a deposit of desired thickness. For circuit board manufacture, a typical thickness may range between 10 and 50 microns, typically from 20 to 35 microns. A plating time of from 15 to 90 minutes would typically be required to obtain a deposit of the desired thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The invention will be better understood by reference to the examples which follow where, unless stated otherwise, the substrate treated was a copper clad epoxy glass circuit board base material provided with a random array of through-holes. Commercial formulations used in the examples are available from Shipley Company, L.L.C.

EXAMPLE 1

A solution was formed consisting of 200 ml of deionized water and 3 gms of a stabilizer identified as Igepal CO990 FLK having in excess of 100 moles of ethylene oxide repeating units and an HLB in excess of 19. A dopant in an amount of 11 grams is then added. The dopant used is paratoluene sulfonic acid available from Aldrich Chemical Company. Thereafter, 2.0 gms of pyrrole and 80 mls of water are added. The colloid is then formed by the slow addition of 17.7 ml of a 40 weight percent solution of sodium persulfate. All additions are made with mild agitation. Stirring is continued for thirty minutes following the addition of the sodium persulfate. A black suspension was thus formed.

EXAMPLE 2

This example illustrates plating of a double sided through-hole board using the conductive polymer suspension of Example 1.

A drilled copper clad epoxide/glass FR4 multilayer printed circuit board panel was desmeared by immersion in MLB Conditioner 3302 for 5 minutes at 80° C., cold water rinsed, then immersed in alkaline permanganate solution MLB Promoter 3308 for 6 minutes at 80° C., cold water rinsed, then Neutralizer 3314 for 2 minutes at 25° C. and cold water rinsed. (All cold water rinses were for 2 minutes.) The so treated panel was then immersed in Cleaner Conditioner XP 9420, an aqueous alkaline solution consisting of a cationic polymeric surfactant for 5 minutes at 40° C. and cold water rinsed at room temperature for 2 minutes. The panel was then immersed in the polymer suspension of Example 1 at room temperature for 5 minutes and cold water rinsed at room temperature for 60 seconds. The panel was then subjected to a final etch in peroxyacetic acid at a temperature 33° C. for 1.5 minutes and then plated at room temperature at 2 amps per $dm^2$ in an acid copper electroplating solution identified as EP-1000 for 60 minutes. The deposit was continuous over the epoxide/glass substrate in the drilled through-holes and well adhered to the hole wall surfaces.

EXAMPLE 3

The procedure of Example 2 was repeated using the conductive polymer of Example 1 after storage for 30 days at room temperature in a sealed bottle. Similar results were obtained.

EXAMPLE 4

The procedure of Example 1 was repeated substituting Rodasurf TB970 for the surfactant used in Example 1. The Rhodasurf stabilizer is a linear alcohol ethoxylate with and HLB of 19. Similar results were obtained.

EXAMPLE 5

The procedure of Example 2 was repeated using the conductive polymer of Example 4 stored for 30 days in a sealed container at room temperature. Following formation of the coating over the dielectric surface, a continuous metal coating was obtained.

EXAMPLE 6

The procedures of Example 1 was repeated, but the stabilizer used was polyvinylpyrrolidone. Prior to storage, metal would deposit on the substrate but voids in the plating were evident. Following 30 day storage, metal would not deposit from the electroplating solution.

EXAMPLE 7

The procedure of Example 1 was repeated using a conductive polymer stabilized with an ethylene oxide polymer identified as Avanol S150, an electrosteric stabilizer that is the sodium salt of a sulfonic acid having 15 repeating ethylene oxide groups and an HLB of 16. Similar results were obtained as in Example 1. The freshly prepared conductive polymer colloid was then used in the process of Example 2. Again, similar results were obtained.

EXAMPLE 8

The procedure of Example 1 was repeated using a stabilizer identified as Pluronics F127 available from BASF. The stabilizer is a polyoxyethylene-polyoxypropylene block copolymer having a molecular weight of 12,600 and an HLB of 16. Similar results were obtained. The freshly prepared colloid was then used in the process of Example 2 and again, similar results were obtained.

We claim:

1. A method for electroplating the surface of a nonconductor comprising the steps of contacting the nonconductor with an aqueous suspension of a conductive polymer to deposit a conductive polymer layer over the surface of said nonconductor and metal plating the surface of the nonconductor by passing a current between electrodes immersed in an electrolyte containing dissolved plating metal where one of said electrodes comprises said nonconductor to be plated, said aqueous suspension of the conductive polymer containing a stabilizing concentration of a polymeric stabilizer having the structural formula:

$$RO[(CH_mCH_{2m}O)_a(CH_{m'}CH_{2m'}O)]_bAR'M$$

where R is a hydrocarbon group having from 1 to 40 carbon atoms, m and m' differ from each other and each is a whole integers of from 1 to 4, and a and b are whole integers varying between 0 and 1000 provided that a+b is at least 3, R' is an alkyl group having from 1 to 8 carbon atoms, A is an anion and M is a counteracting cation and a hydrophilic—lipophilic balance (HLB) in excess of 12.

2. The method of claim 1 where the stabilizer has an HLB in excess of 15.

3. The method of claim 1 where m is 2.

4. The method of claim 1 where A is sulfonic acid and M is an alkali metal.

5. The method of claim 1 where the nonconductor is a copper clad printed circuit board substrate having through-holes extending from one of its surfaces to the other of its surfaces.

6. The method of claim 1 where R is alkyl having from 3 to 20 carbon atoms.

7. The method of claim 6 where m is 2.

8. The method of claim 1 where the polymeric stabilizer conforms to the following general formula:

$$C_{m''}H_{2m''+1}(OC_2H_4)_nOSO_3M$$

where m" is a whole integer ranging between 3 and 20, M is an alkali metal and n varies between 3 and 1,000.

9. The method of claim 8 where n varies between 7 and 50.

* * * * *